United States Patent
Schulze et al.

(10) Patent No.: US 10,541,301 B2
(45) Date of Patent: Jan. 21, 2020

(54) SIC-BASED SUPERJUNCTION SEMICONDUCTOR DEVICE

(71) Applicant: Infineon Technologies AG, Neubiberg (DE)

(72) Inventors: Hans-Joachim Schulze, Taufkirchen (DE); Wolfgang Jantscher, Villach (AT); Roland Rupp, Lauf (DE); Werner Schustereder, Villach (AT); Hans Weber, Bayerisch Gmain (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/854,341

(22) Filed: Dec. 26, 2017

(65) Prior Publication Data

US 2018/0138266 A1    May 17, 2018

Related U.S. Application Data

(62) Division of application No. 15/016,680, filed on Feb. 5, 2016, now Pat. No. 9,859,361.

(30) Foreign Application Priority Data

Feb. 6, 2015    (DE) .......................... 10 2015 202 121

(51) Int. Cl.
*H01L 29/06* (2006.01)
*H01L 21/04* (2006.01)
(Continued)

(52) U.S. Cl.
CPC ........ *H01L 29/0634* (2013.01); *H01L 21/046* (2013.01); *H01L 21/0465* (2013.01);
(Continued)

(58) Field of Classification Search
CPC ............. H01L 29/0615; H01L 29/0634; H01L 29/1608; H01L 21/046; H01L 21/0465; H01L 21/266
See application file for complete search history.

(56) References Cited

U.S. PATENT DOCUMENTS

| | | | |
|---|---|---|---|
| 6,346,464 B1 * | 2/2002 | Takeda | ................. H01L 21/261 438/514 |
| 2007/0003839 A1 | 1/2007 | Rabarot et al. | |
| 2012/0273916 A1 | 11/2012 | Yedinak et al. | |

FOREIGN PATENT DOCUMENTS

| | | |
|---|---|---|
| DE | 602004005210 T2 | 11/2007 |
| JP | 2001015448 A | 1/2001 |

(Continued)

OTHER PUBLICATIONS

Millan, Jose, "A Review of WBG Power Semiconductor Devices", IEEE 2012 International Semiconductor Conference (CAS), 2012, pp, 57-66.

*Primary Examiner* — Matthew E Warren
(74) *Attorney, Agent, or Firm* — Murphy, Bilak & Homiller, PLLC

(57) ABSTRACT

A method of producing a semiconductor device includes providing a semiconductor body including a semiconductor body material having a dopant diffusion coefficient that is smaller than the corresponding dopant diffusion coefficient of silicon. At least one first semiconductor region doped with dopants of a first conductivity type is produced in the semiconductor body, including by applying a first implantation of first implantation ions. At least one second semiconductor region adjacent to the at least one first semiconductor region and doped with dopants of a second conductivity type complementary to the first conductivity type is produced in the semiconductor body, including by applying a second implantation of second implantation ions.

14 Claims, 6 Drawing Sheets

(51) Int. Cl.
  *H01L 21/266* (2006.01)
  *H01L 21/265* (2006.01)
  *H01L 29/16* (2006.01)
  *H01L 29/20* (2006.01)

(52) U.S. Cl.
  CPC ...... *H01L 21/266* (2013.01); *H01L 21/26546* (2013.01); *H01L 29/0615* (2013.01); *H01L 29/1608* (2013.01); *H01L 29/2003* (2013.01)

(56) References Cited

FOREIGN PATENT DOCUMENTS

| JP | 2001522145 A | 11/2001 |
| JP | 2003069040 A | 3/2003 |
| JP | 2003273355 A | 9/2003 |
| JP | 2007311669 A | 11/2007 |

\* cited by examiner

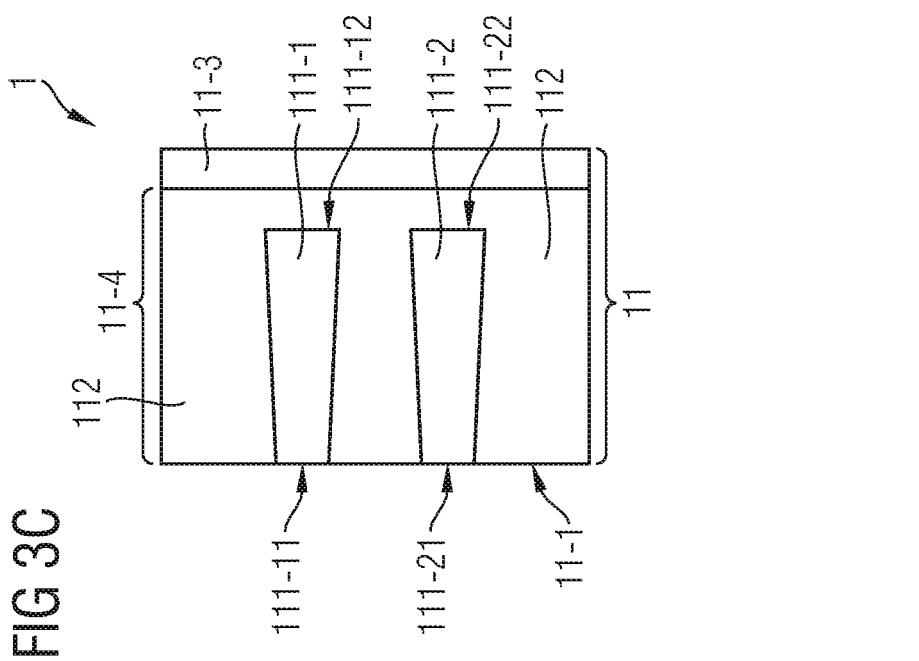
FIG 3C
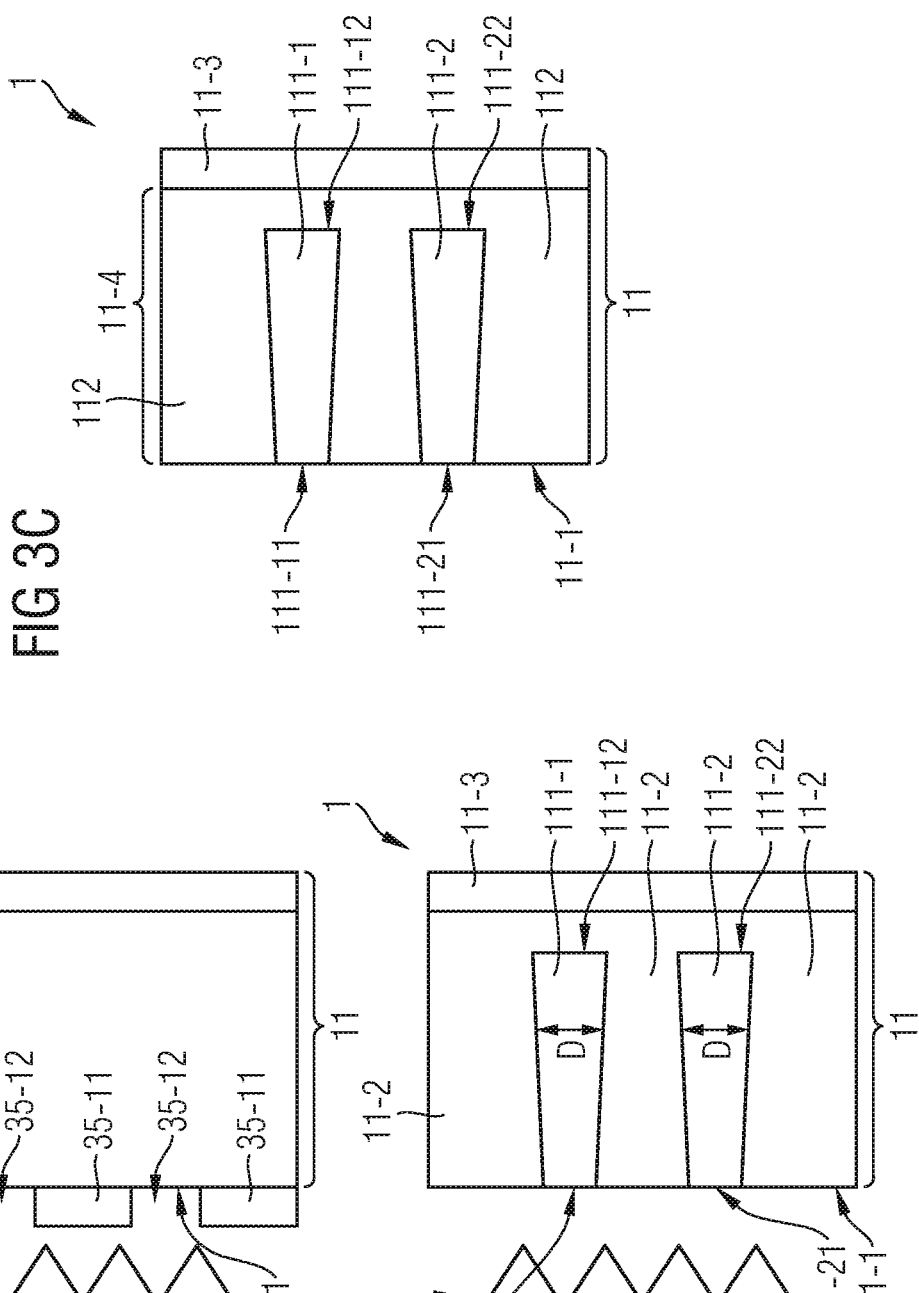
FIG 3A
FIG 3B

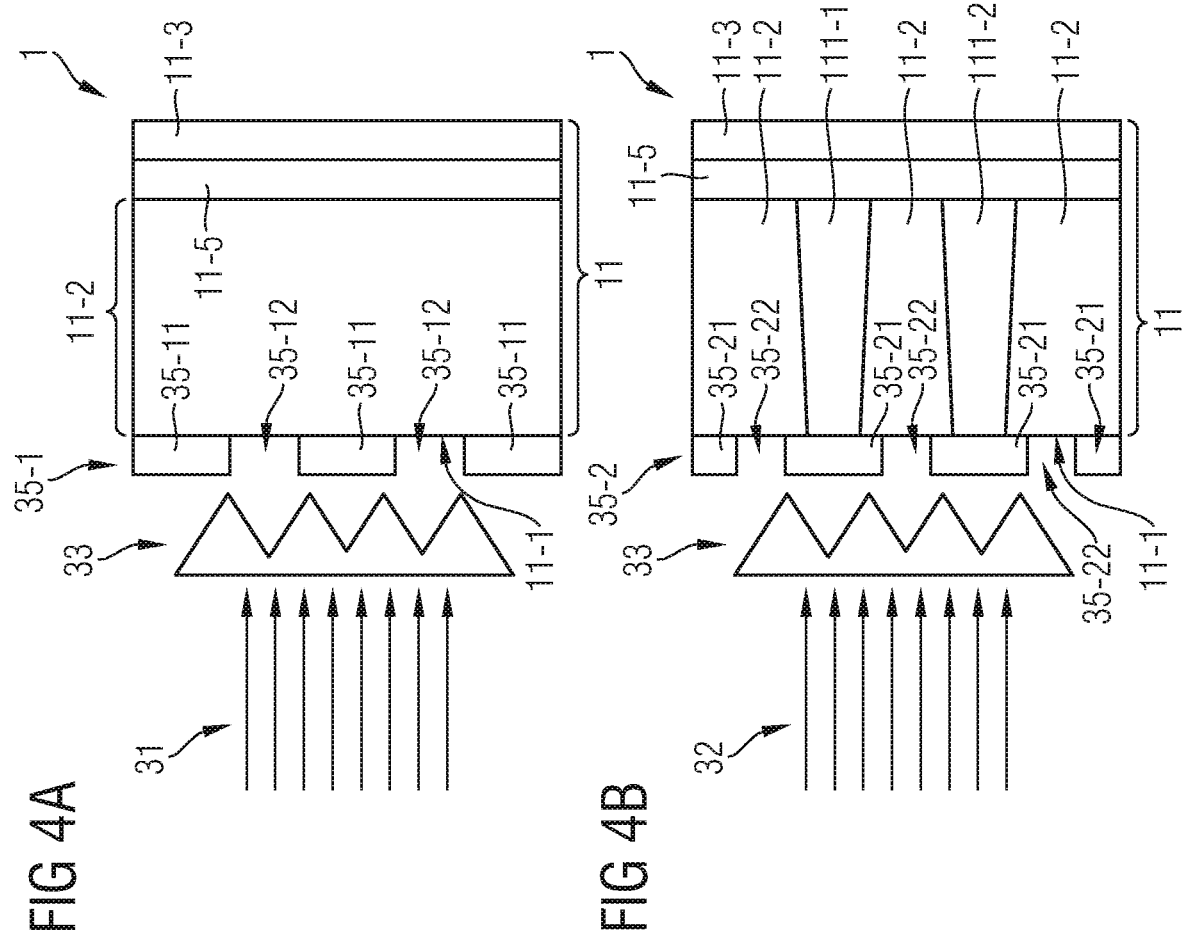

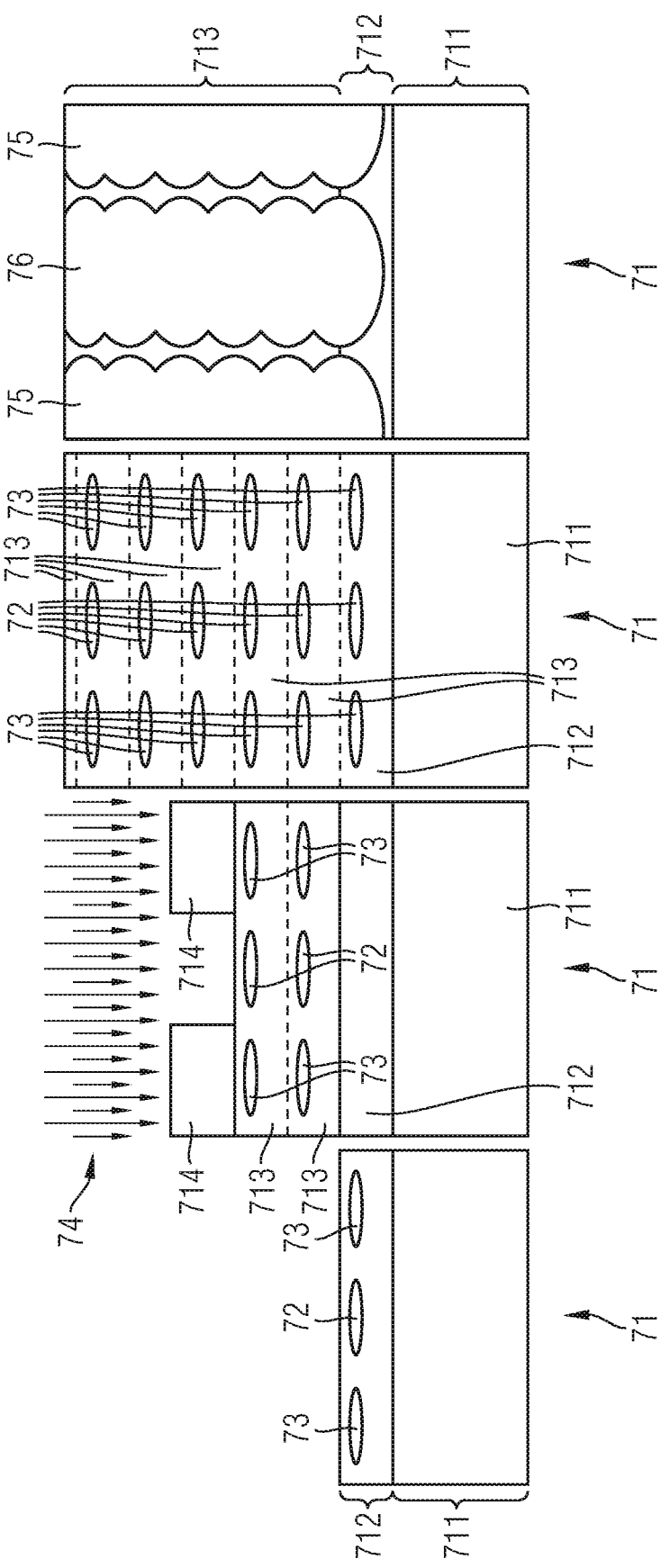

SIC-BASED SUPERJUNCTION SEMICONDUCTOR DEVICE

BACKGROUND

Many functions of modern devices in automotive, consumer and industrial applications, such as converting electrical energy and driving an electric motor or an electric machine, rely on semiconductor devices. For example, Insulated Gate Bipolar Transistors (IGBTs), Metal Oxide Semiconductor Field Effect Transistors (MOSFETs), diodes and similar devices have been used for various applications including, but not limited to switches in power supplies and power converters.

For improving the switching behavior of such a semiconductor device and/or the efficiency of a power converter using such semiconductor devices, so-called superjunction structures have been introduced. Occasionally, semiconductor devices having such superjunction structure are also referred to as "compensation devices", "CoolMOS™ devices", "SJ devices" or "RESURF devices". The superjunction structure is a charge compensation structure. For example, by means of a superjunction structure, the resistance in an epitaxial layer in a high voltage MOSFET can be substantially reduced, e.g., by a factor of greater than 5.

It is generally challenging producing a superjunction structure (which is also referred to as "compensation structure") within a semiconductor device with sufficient accuracy, in particular with sufficient accuracy of a grade of charge compensation. Producing an accurate superjunction structure becomes even more challenging if the diffusion coefficient of the semiconductor body material is comparatively small.

SUMMARY

According to an embodiment, a semiconductor device is presented. The semiconductor device comprises a semiconductor body that comprises a semiconductor body material having a dopant diffusion coefficient that is smaller than the corresponding dopant diffusion coefficient of silicon. The semiconductor device further comprises at least one first semiconductor region doped with dopants of a first conductivity type and having a columnar shape that extends into the semiconductor body along an extension direction. A respective width of the at least one first semiconductor region continuously increases along the extension direction. The semiconductor device also comprises at least one second semiconductor region included in the semiconductor body. The at least one second semiconductor region is arranged adjacent to the at least one first semiconductor region, and is doped with dopants of a second conductivity type complementary to the first conductivity type.

According to another embodiment, a further semiconductor device is presented. The further semiconductor device comprises: a semiconductor body that comprises a semiconductor body material having a dopant diffusion coefficient that is smaller than the corresponding dopant diffusion coefficient of silicon, and at least one first semiconductor region included in the semiconductor body. The at least one first semiconductor region is doped with implanted dopants of a first conductivity type and has columnar shape that extends into the semiconductor body along an extension direction. The semiconductor device further comprises at least one second semiconductor region included in the semiconductor body. The at least one second semiconductor region is arranged adjacent to the at least one first semiconductor region, and is doped with implanted dopants of a second conductivity type complementary to the first conductivity type. A transition between the at least one first semiconductor region and the at least one second semiconductor region in a direction perpendicular to the extension direction forms, in a vertical cross-section of the semiconductor device, a straight line at least along 50% of the total extension of the at least one first semiconductor region along the extension direction.

According to yet a further embodiment, a method of producing a semiconductor device is presented. The method comprises: providing a semiconductor body that comprises a semiconductor body material having a dopant diffusion coefficient that is smaller than the corresponding dopant diffusion coefficient of silicon; producing, in the semiconductor body, at least one first semiconductor region doped with dopants of a first conductivity type, wherein producing the at least one first semiconductor region includes applying a first implantation of first implantation ions; and producing, in the semiconductor body, at least one second semiconductor region adjacent to the at least one first semiconductor region and doped with dopants of a second conductivity type complementary to the first conductivity type, wherein producing the at least one second semiconductor region includes applying a second implantation of second implantation ions.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis being placed upon illustrating principles of the invention. Moreover, in the figures, like reference numerals designate corresponding parts. In the drawings:

FIG. 3A-3C schematically illustrate a method of producing a semiconductor device according to one or more embodiments;

FIG. 4A-4C schematically illustrate a method of producing a semiconductor device according to one or more embodiments;

FIG. 7A-7D schematically illustrate a method of producing a semiconductor device.

DETAILED DESCRIPTION

Figure 1:
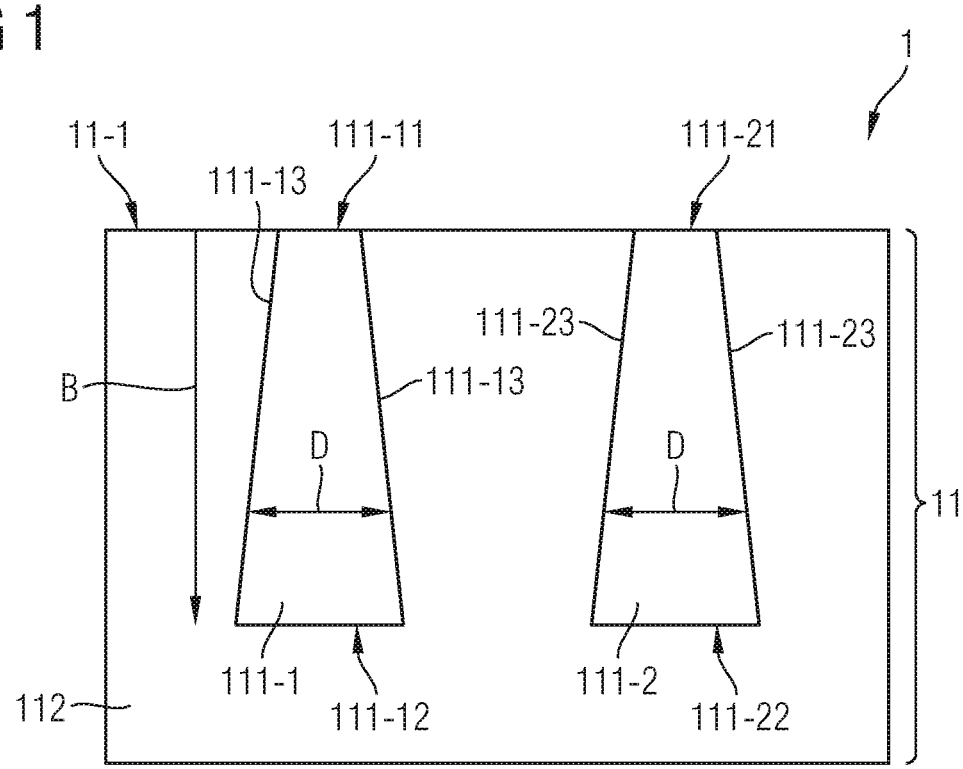
FIG. 1 schematically illustrates a section of a vertical cross-section of a semiconductor device according to one or more embodiments.

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor region. This can be for instance the surface of a wafer or a die, e.g., the surface of a semiconductor body.

The term "vertical" as used in this specification intends to describe an orientation which is substantially arranged perpendicular to the horizontal surface, i.e., parallel to the normal direction of the surface of the semiconductor substrate or semiconductor region.

In this specification, p-doped is referred to as "first conductivity type" while n-doped is referred to as "second conductivity type". Alternatively, opposite doping relations can be employed so that the first conductivity type can be n-doped and the second conductivity type can be p-doped. E.g., dopants of the first conductivity type may be acceptors, and dopants of the second conductivity type may be donors. Alternatively, dopants of the first conductivity type may be donors, and dopants of the second conductivity type may be acceptors.

Further, within this specification, the term "doping concentration" may refer to an integral doping concentration or, respectively, to a mean doping concentration or to a sheet charge carrier concentration of a specific semiconductor region. Thus, e.g., a statement saying that a specific semiconductor region exhibits a certain doping concentration that is higher or lower as compared to a doping concentration of another semiconductor region may indicate that the respective mean doping concentrations of the semiconductor regions differ from each other.

Specific embodiments described in this specification pertain to, without being limited thereto, monolithically integrated power semiconductor devices, e.g. to monolithically integrated power semiconductor devices that may be used within an electrical power converter.

The term "power semiconductor device" as used in this specification intends to describe a semiconductor device on a single chip with high voltage blocking and switching and/or high current-carrying and switching capabilities. In other words, the power semiconductor devices are intended for high current, typically in the Ampere range, e.g., up to several ten Ampere, and/or high voltages, typically above 50 V, more typically 200 V and above.

In the context of the present specification, the terms "in ohmic contact", "in electric contact", "in ohmic connection", and "electrically connected" intend to describe that there is a low ohmic electric connection or low ohmic current path between two regions, sections, portions or parts of a semiconductor device or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device; e.g., a transition between two elements being in contact with each other may not include a further intermediate element or the like.

FIG. 7A to FIG. 7D schematically illustrate an approach of producing a semiconductor device 71. The semiconductor device 71 may comprise a semiconductor base region 711 and a doped semiconductor region 712 on top of the semiconductor base region 711. For example, both the semiconductor base region 711 and the doped semiconductor region 712 are based on silicon. Further, the doped semiconductor region 712 can be an n-doped region. This doped semiconductor region 712 can be an epitaxial n-doped layer that comprises a first region 72 and second regions 73 in the shape of respective bubbles. For example, the second bubbles 73 are p-doped and the first bubbles 72 are n-doped. The bubbles 72 and 73 can be created by carrying out an ion implantation. In a next step illustrated in FIG. 7B, further non-doped or weakly doped epitaxial layers 713 may be produced on top of the doped semiconductor region 712. Within each of these non-doped or weakly doped epitaxial layers 713, further first bubbles 73 and second bubbles 72 may be produced by carrying out respective implantation steps 74 and by arranging a mask 714 on the surface of the most upper layer 713. These steps may be repeated until a structure as schematically illustrated in FIG. 7C has been accomplished. In a final step schematically illustrated in FIG. 7D, the plurality of bubbles being positioned above of each other can be merged into respective first columnar semiconductor regions 75 and in a respective second columnar semiconductor region 76 by carrying out an extensive thermal diffusion process.

In accordance with the method illustrated in FIG. 7A to 7D, a superjunction structure is established within the semiconductor device 71. Since this approach of producing the semiconductor device 71 comprises producing a plurality of epitaxial layers 712 and 713 and carrying out a plurality of implantation steps 74, this approach is also referred to as a "multi-epitaxy-multi-implantation process". Due to the thermal diffusion process that is carried out in order to merge the plurality of bubbles being vertically spaced apart from each other (cf. FIG. 7C), also a lateral extension of the implantation regions, i.e., of the bubbles, can be observed. Such lateral extension may result in a comparatively high waviness of a junction area defined by a transition between the respective columnar semiconductor regions 75 and 76 and the epitaxial layers 712 and 713. Such high waviness, however, may deteriorate the performance of the semiconductor device 71. For example, such high waviness may result in a rather high on-state resistance of a semiconductor device 71.

Figure 8A:
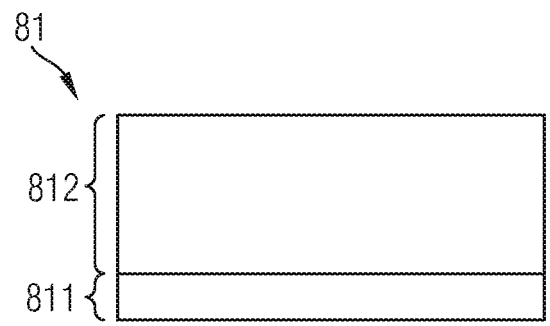
FIG. 8A-8D schematically illustrate a method of producing a semiconductor device.
Figure 8B:
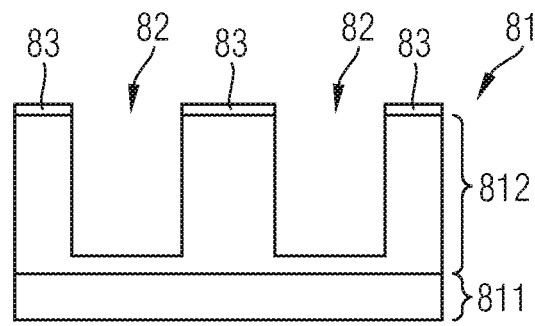
Figure 8C:
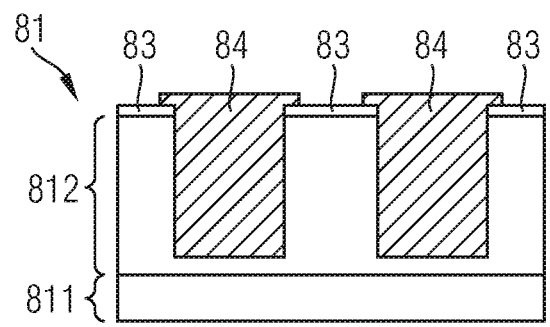
Figure 8D:
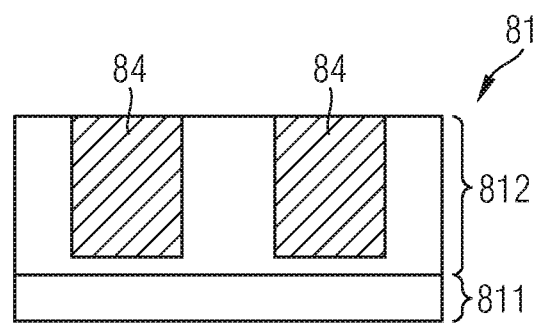

Another approach of producing a semiconductor device having a superjunction structure is schematically illustrated in FIG. 8A to FIG. 8D. This approach can be referred to as a "trench-epitaxy-fill process". For example, the superjunction structure is produced in a semiconductor device 81 having a semiconductor base region 811 and a doped semiconductor region 812. The doped semiconductor region 812 can be an n-doped semiconductor region. In a first step, a mask 83 may be arranged on top of the doped semiconductor region 812 and some empty trenches 82 may be formed within the doped semiconductor region 812 (cf. FIG. 8B). In a subsequent step, the trenches 82 may be filled with a trench filling material 84, which may be a p-doped semiconductor material. In a next step that is schematically illustrated in FIG. 8D, a chemical mechanical polishing (CMP) may be carried out in order to remove the mask 83 and protruding parts of the trench filling material 84. Even though carrying out a thermal diffusion step may be avoided within the trench-epitaxy-fill-process, applying a selective epitaxy in order to fill the trenches 82 may comprise comparatively high scatterings. Therefore, the semiconductor device 81 may exhibit comparatively high compensation scatterings, which may reduce the performance of the semiconductor device 81. For example, the scatterings may result in a comparatively high on-state resistance of a semiconductor device 81.

FIG. 1 schematically illustrates a section of a vertical cross-section of a semiconductor device 1 according to one or more embodiments. The semiconductor device 1 comprises a semiconductor body 11, wherein the semiconductor body 11 includes a semiconductor body material that exhibits a dopant diffusion coefficient that is smaller than the corresponding dopant diffusion coefficient of silicon.

For example, the semiconductor body material comprises at least one of silicon carbide, gallium nitride, aluminum nitride, or another semiconductor material that exhibits a dopant diffusion coefficient that is at least two orders of magnitude lower than the corresponding dopant diffusion coefficient of silicon.

In an embodiment, the dopant diffusion coefficients may be determined at applicable processing temperatures. For example, silicon carbide may exhibit a post implant annealing temperature in the range of 1700° C. to 1800° C., in case of silicon such post implant annealing temperature may be lower as 1700° C., such as approximately 1100° C.

Further, the semiconductor body 11 may be a silicon carbide semiconductor body, a gallium nitride semiconductor body, an aluminum nitride semiconductor body or the like.

The dopant diffusion coefficient may either be the acceptor diffusion coefficient or the donor diffusion coefficient.

For example, the semiconductor body material of the semiconductor body 11 exhibits a donor diffusion coefficient that is smaller than $10^{-13}$ cm$^2$/s, or smaller than $10^{-14}$ cm$^2$/s, or even smaller than $10^{-15}$ cm$^2$/s, e.g., at respectively determined at an applicable processing temperature of, e.g., 1800° C. in case of silicon carbide as semiconductor body material.

The semiconductor body material may further exhibit an acceptor diffusion coefficient that is smaller than $10^{-13}$ cm$^2$/s, or smaller than $10^{-14}$, or even smaller than $10^{-15}$ cm$^2$/s, e.g., at respectively determined at an applicable processing temperature of, e.g., 1800° C. in case of silicon carbide as semiconductor body material.

The semiconductor device 1 further comprises first semiconductor regions 111-1 and 111-2 included in the semiconductor body 11. Even though FIG. 1 schematically illustrates that the semiconductor device 1 includes two first semiconductor regions 111-1 and 111-2, it shall be understood that the semiconductor device 1 may also include only one of such first semiconductor regions, e.g., only the first semiconductor region 111-1 or the first semiconductor region 111-2 or, respectively, more than two first semiconductor regions.

The first semiconductor regions 111-1 and 111-2 can be doped with dopants of a first conductivity type. For example, the first semiconductor regions 111-1 and 111-2 are doped with acceptors. However, it is not a requirement that all first semiconductor regions 111-1 and 111-2 are doped with the same dopants. For example, it is possible that the first semiconductor region 111-1 is doped with dopants of the first conductivity type and that the second semiconductor region 111-2 is doped with dopants of a second conductivity type complementary to the first conductivity type.

For example, the first semiconductor region 111-1 and 111-2 may each exhibit a columnar shape that extends into the semiconductor body 11 along an extension direction B. A respective width D of the first semiconductor regions 111-1 and 111-2 continuously increases along the extension direction B, which will be explained in more detail below with respect to FIG. 2.

For example, the continuously increasing width D along the extension direction B may constitute the columnar shape of each of the first semiconductor regions 111-1 and 111-2.

It shall be understood that each of the first semiconductor regions 111-1 and 111-2 may also extend into a lateral direction substantially perpendicular to the extension direction B, substantially perpendicular to the width D and substantially parallel to a surface 11-1 of a semiconductor body 11, e.g., even farer as compared to the total extension in the extension direction B. Thereby, each of the first semiconductor regions 111-1 and 111-2 may further exhibit a stripe shape. Still, such shape of the first semiconductor regions 111-1 and 111-2 shall be considered to be a columnar shape in the sense of the present specification.

For example, at least one of the first semiconductor regions 111-1 and 111-2 exhibits, in a first vertical cross-section, e.g., as schematically illustrated in each of FIG. 1 to FIG. 4C, the columnar shape. Further, the at least one of the first semiconductor regions 111-1 and 111-2 may simultaneously exhibit, in a second (non-illustrated) vertical cross-section that is perpendicular to the first vertical cross-section the stripe shape.

The semiconductor device 1 further includes at least one second semiconductor region 112 included in the semiconductor body 11, wherein the second semiconductor region 112 is arranged adjacent to the first semiconductor regions 111-1 and 111-2. The second semiconductor region 112 may be in contact with the first semiconductor regions 111-1 and 111-2. The second semiconductor region 112 is doped with dopants of a second conductivity type complementary to the first conductivity type. For example, the second semiconductor region 112 is doped with donors.

For example, both the first semiconductor regions 111-1 and 111-2 on the one side and the second semiconductor region 112 on the other side may have a comparable doping concentration in order to achieve a required charge balance.

In an embodiment, the doping concentration of the second semiconductor region 112 is chosen such that the semiconductor device 1 exhibits a sufficiently low on-state resistance, so as to allow for low conduction losses. Further, the doping concentration of each of the first semiconductor regions 111-1 and 111-2 may be chosen in dependence of the doping concentration of the second semiconductor region 112 in order to achieve the required charge balance, e.g., a required degree of compensation, so as to allow for low switching losses of the semiconductor device 1. For example, the doping concentration of each of the first semiconductor regions 111-1 and 111-2 is substantially identical to the doping concentration of the second semiconductor region 112.

In accordance with an embodiment, the doping concentration of at least one of the first semiconductor regions 111-1 and 111-2 along the extension direction B deviates by less than 50%, or less than 30%, or less than 20%, or less than 10%, or even less than 5% from a fixed value at least along 10% of the total extension of the at least one of the first semiconductor regions 111-1 and 111-2, for example at least along 0.3 µm, at least along 1 µm, or at least along 2 µm, or at least along 3 µm, or even along more than 3 µm in the extension direction B. Further, at a given depth of the at least one of the first semiconductor regions 111-1 and 111-2 in the extension direction B, the doping concentration may by substantially constant along at least 80%, at least 90% or along at least 95% of the width D at the given depth.

For example, the fixed value may be a maximum value or a mean value of the doping concentration being present within the at least one of the first semiconductor regions 111-1 and 111-2 or, respectively, a maximum value or a mean value of the doping concentration being present within the second semiconductor region 112.

For example, the first semiconductor regions 111-1 and 111-2 have been produced by applying at least a first implantation of first implantations ions. Also, the second semiconductor region 112 may have been produced by applying at least a second implantation of second implantation ions.

In other words, the first semiconductor regions 111-1 and 111-2 may be semiconductor regions that comprise the semiconductor body material being doped with implanted dopants of a first conductivity type and the second semiconductor region 112 included in the semiconductor body 11 may be a semiconductor region that comprise the semiconductor body material being doped with implanted dopants of a second conductivity type complementary to the first conductivity type.

For example, the first semiconductor regions 111-1 and 111-2 and the second semiconductor region 112 form a drift volume having a superjunction structure. For example, such drift volume of the semiconductor device 1 may be part of a silicon carbide based power MOSFET or another semiconductor device.

A transition between the first semiconductor region 111-1 and the second semiconductor region 112 in a direction perpendicular to the extension direction B forms a junction area 111-13. Correspondingly, a transition between the first semiconductor region 111-2 and the second semiconductor region 112 in a direction perpendicular to the extension direction B forms another junction area 111-23. Both junction areas 111-13 and 111-23 may exhibit a comparably low waviness.

For example, the width D of the first semiconductor region 111-1 may be defined by a distance between the opposite junction areas 111-13, and the width D of the other first semiconductor region 111-2 may be defined by a distance between the opposite junction areas 111-23.

Figure 2:
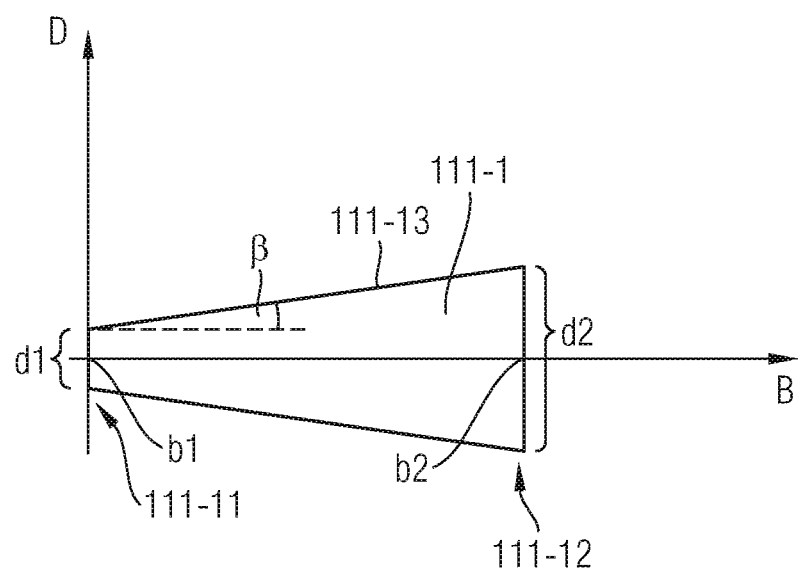
FIG. 2 schematically illustrates a section of a vertical cross-section of a first semiconductor region of a semiconductor device according to one or more embodiments.

In the vertical cross-section illustrated in FIGS. 1 and 2, the junction areas 111-13 and 111-23 between the first semiconductor regions 111-1, 111-2 on the one side and the second semiconductor region 112 on the other side appear as a line. For example, the line is a straight line for at least 50% of the total extension of the respective first semiconductor region 111-1, 111-2 along the extension direction B. The line may be a straight line for more than 50% of the total extension, such as for more than 60%, more than 75%, more than 95% or even more than 98% of the total extension. Correspondingly, the junction areas 111-13 and 111-23 may exhibit a low waviness for more than 50% of the total extension, such as for more than 60%, more than 75%, more than 95% or even more than 98% of the total extension. The aspect of the low waviness will be explained in more detail with respect to FIG. 2.

FIG. 2 schematically illustrates a section of vertical cross-section of the first semiconductor region 111-1 included in the semiconductor body 11 of the semiconductor device 1 illustrated in FIG. 1. For simplifying the description, the semiconductor region 111-1 is illustrated in a 90° turn as compared to the illustration in FIG. 1. The first semiconductor region 111-1 comprises a proximal end 111-11 and a distal end 111-12. The proximal end 111-11 is the closest end with regards to the surface 11-1 and the distal end 111-12 is the end furthest from the surface 11-1. Correspondingly, the further first semiconductor region 111-2 also comprises a proximal end 111-21 and a distal end 111-22.

The proximal end 111-11 of the first semiconductor region 111-1 exhibits a proximal width d1 and the distal end exhibits a distal width d2. The width D at every other position between the proximal end 111-11 and the distal end 111-12 along the extension direction B of the first semiconductor region 111-1 is larger than the proximal width d1 and smaller than the distal width d2.

For example, the rate of change of the width D of the first semiconductor region 111-1 along the extension direction B is positive. Further, in accordance with an embodiment, the rate of change is substantially constant. Thereby, the junction area 111-13 exhibiting the low waviness or, respectively, with regards to the vertical cross-section, the straight line may be formed.

Thus, within the scope of the present specification, the formulation "straight line" may express that the rate of change of the width D, i.e., the increase of the width D along the extension direction B, is substantially constant along the extension direction B. In contrast, the rate of change of the width of the columnar semiconductor regions 75 and 76 that have been produced in accordance with the multi-epitaxy-multi-implantation process including the thermal diffusion step (schematically illustrated in FIG. 7A to 7D) varies and may be positive and negative along the extension direction. Therefore, the waviness of the junction area defined by a transition between the respective columnar semiconductor regions 75 and 76 and the epitaxial layers 712 and 713 is comparatively high and, in a vertical cross-section, no straight line is formed by the transition but a rippled line exhibiting a comparatively high ripple.

For example, the rate of change of the respective width of the first semiconductor region 111-1 is given by an extension angle β, wherein the extension angle β is identical to an intersection angle at a virtual intersection of the extension direction B and the junction area 111-13. For example, this extension angle β is within the range from 0.1° to 10°, such as approximately 3°. Further, the extension angle β may be substantially constant along the entire extension of the first semiconductor region 111-1.

As illustrated in FIG. 1 and FIG. 2, the extension direction B is substantially perpendicular to the surface 11-1 of the semiconductor body 11 such that the first semiconductor regions 111-1 and 111-2 extend vertically into the semiconductor body 11.

FIG. 3A to FIG. 3C and FIG. 4A to FIG. 4C schematically illustrate methods of producing a semiconductor device according to one or more embodiments, e.g., methods of producing the semiconductor device 1 schematically illustrated in FIG. 1.

In a first step illustrated in FIG. 3A and FIG. 4A, a semiconductor body 11 is provided, wherein the semiconductor body 11 comprises a semiconductor body material that exhibits a dopant diffusion coefficient that is smaller than the corresponding dopant diffusion coefficient of silicon. Exemplary values of such dopant diffusion coefficient of the semiconductor body material of a semiconductor body 11 have already been given above. For example, the semiconductor body 11 may a silicon carbide semiconductor body, a gallium nitride semiconductor body, an aluminum nitride semiconductor body or the like.

The provided semiconductor body 11 may comprise a base region 11-3 which may be a highly doped semiconductor region. Prior to carrying out the implantations 31 and 32, the semiconductor body 11 may comprise an initially non-doped or weakly doped region 11-2. For example, the initially non-doped or weakly doped region 11-2 is one of a silicon carbide layer, a gallium nitride layer, an aluminum nitride layer, or a layer of another semiconductor material that exhibits a dopant diffusion coefficient being at least two orders of magnitude lower than the corresponding dopant diffusion coefficient of silicon, e.g., compared at applicable processing temperatures. For instance, the first implantation 31 is carried out so as to produce the first semiconductor regions 111-1 and 111-2 in the otherwise non-doped or weakly doped semiconductor region 11-2.

In a next step illustrated in FIGS. 3A and 3B, first semiconductor regions 111-1 and 111-2 are produced in the semiconductor body 11. As already explained with respect to FIG. 1, it may be sufficient to produce only one first semiconductor region, such as the first semiconductor region 111-1. Alternatively more than two first semiconductor regions 111-1 and 111-2 may be produced within the producing step distributed along lateral extensions perpendicular to the extension direction B.

Producing the first semiconductor regions 111-1 and 111-2 may include applying a first implantation 31 of a first implantation ions. For example, first implantation ions may comprise acceptors such that the first semiconductor regions 111-1 and 111-2 become p-doped.

In a subsequent step that is schematically illustrated in FIGS. 3B and 3C, a second semiconductor region 112 is produced within the semiconductor body 11 and adjacent to the first semiconductor regions 111-1 and 111-2. Producing the second semiconductor region 112 may include applying a second implantation 32 of second implantation ions. For example, the second implantation ions may comprise donors such that the second semiconductor region 112 becomes n-doped.

In other words, both the first semiconductor regions 111-1 and 111-2 and the second semiconductor region 112 may be produced by means of implantation. Both donors and acceptors may be introduced into the semiconductor body 11 by implantation.

The produced first semiconductor regions 111-1 and 111-2 and the produced second semiconductor region 112 may form a drift region 11-4 that exhibits a superjunction structure. The drift volume 11-4 formed by the second semiconductor region 112 and the first semiconductor regions 111-1 and 111-2 may be in contact with the base region 11-3. This base region 11-3 may be a comparatively highly doped semiconductor region. The base region 11-3 may exhibit a doping concentration that is higher than the doping concentration of the second semiconductor region 112.

For example, the first implantation 31 is carried out such that the first semiconductor region 111-1 exhibits a columnar shape that extends into the semiconductor body 11 along an extension direction B, wherein a width D of the first semiconductor region 111-1 continuously increases along the extension direction (B), as schematically illustrated also in FIG. 1 and FIG. 2. To this end, the surface 11-1 of the semiconductor body 11 may be masked with a first mask 35-1 wherein the first implantation 31 can be applied while the surface 11-1 is masked with the first mask 35-1. The first mask 35-1 may define the extension profile of the first semiconductor regions 111-1 and 111-2.

For example, the first mask 35-1 comprises first mask elements 35-11 spaced apart from each other so as to define the first openings 35-12 that allow the first implantation ions to enter the semiconductor body 11.

After the first implantation 31 has been carried out, the first mask 35-1 may be removed prior to carrying out the second implantation 32, as schematically illustrated in FIG. 3B. For example, as illustrated in FIG. 4B, prior to carrying out the second implantation 32, the surface 11-1 of the semiconductor body 11 can be masked with a second mask 35-2, wherein the second implantation 32 can be applied while the surface 11-1 is masked with the second mask 35-2. For example, the second mask 35-2 exhibits a structure substantially complementary to the structure of the first mask 35-1. The second mask elements 35-21 may be positioned essentially in the area of the first openings 35-12, so as to define second openings 35-22 that allow the second implantation ions to enter the semiconductor body 11.

The method illustrated in FIG. 4A to 4C resembles the method illustrated in FIG. 3A to 3C and what has been stated above with respect to FIG. 3A to 3C applies analogously to FIG. 4A to 4C. However, in accordance with the method illustrated in FIG. 4A to 4C, the provided semiconductor body 11 includes a further doped layer 11-5 adjacent to the base region 11-3. For example, this doped layer 11-5 is doped with dopants of the second conductivity type, which may be donors. Further, prior to carrying out the second implantation 32, the surface 11-1 of the semiconductor body 11 is masked with the second mask 35-2. Compared to the method schematically illustrated in FIG. 3A-3C, there may remain some non-doped or weakly doped regions 11-2 in between the second semiconductor region 112 and the first semiconductor region 111-1 and 111-2 after carrying out the second implantations 32 while the mask 35-2 is on the surface 11-1 of the semiconductor body 11, as schematically illustrated in FIG. 4C.

The method of producing the semiconductor device 1 may further comprise positioning an energy diffusor assembly 33 between an implantation apparatus (not shown) and the semiconductor body 11. Such energy diffusor assembly 33 is schematically illustrated in FIG. 3A, 4A, in FIG. 3B, 4B, in FIG. 5A and in more detail in FIG. 6.

The energy diffusor assembly 33 may be configured for receiving implantation ions and for outputting received implantation ions such that the output implantation ions exhibit a reduced energy as compared to their energy when entering the energy diffusor assembly 33. The energy diffusor assembly may exhibit a structure such that the respective amount of energy reduction depends on the point and/or angle of entry into the energy diffusor assembly 33, which will be explained in more detail below with respect to FIG. 5A.

Applying the first implantation 31 and the second implantation 32 can be carried out such that at least one of the first implantation ions and the second implantation ions traverse the energy diffusor energy 33 prior to entering the semiconductor body 11. For example, the energy diffusor assembly 33 is positioned between the implantation apparatus (not shown) and the semiconductor body 11 while both the first implantation 31 and the second implantation 32 are carried out. Therefore, in this embodiment, both the first implantation ions and the second implantation ions traverse the same energy diffusor assembly 33 prior to entering the semiconductor body 11.

The energy diffusor assembly 33 may be deposited on the surface 11-1 of the semiconductor body 11 or, respectively, on the first mask 35-1 or, respectively on the second mask 35-2. Alternatively, the energy diffusor assembly 33 may be positioned apart from the semiconductor body 11, e.g., by a distance of some mm, such as in the range of 1 mm to 10 mm, e.g., 5 mm.

The energy diffusor assembly 33 may include an energy diffusor material, wherein the energy diffusor material may comprise at least one of silicon, silicon dioxide, aluminum, silicon carbide, graphite, carbon, tungsten, molybdenum, lead, titanium, and copper. For example the energy diffusor assembly 33 may comprise diffusor elements 332-1 to 332-4 made of a monocrystalline material, such as silicon. For instance, the dimensions of the diffusor elements 332-1 to 332-4 are kept small such that a sufficiently large lateral extension of the ion beam for a substantially homogeneous doping concentration profile may be ensured.

For example, the first implantation and/or the second implantation are carried out with an implantation energy within the range from 500 keV to 12 MeV.

Figure 5A:
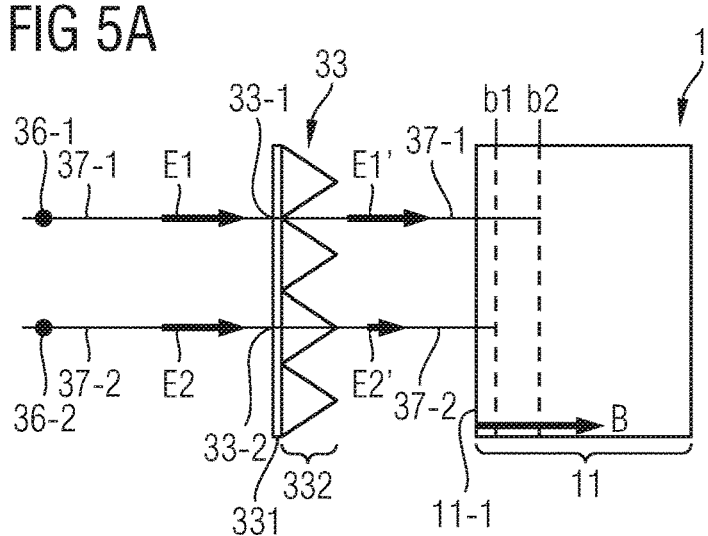
FIG. 5A-5B schematically illustrate an implantation step of a method of producing a semiconductor device according to one or more embodiments.
Figure 5B:
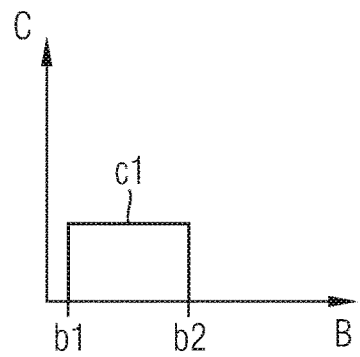
Figure 6:
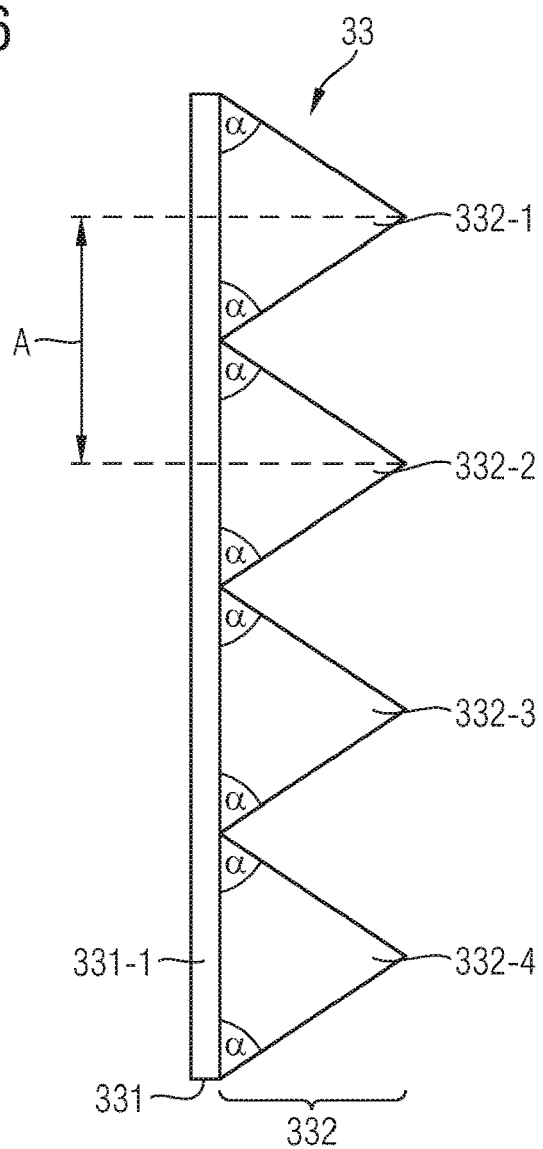
FIG. 6 schematically illustrates a section of a vertical cross-section of an energy diffusor assembly according to one or more embodiments.

FIGS. 5A and 5B schematically illustrate an implantation step that may be carried out within the methods schematically illustrated in FIG. 3A to FIG. 4C. As has been elaborated above, the energy diffusor assembly 33 may be positioned between an implantation apparatus for carrying out the first implantation 31 and/or the second implantation 32 and the semiconductor body 11. The energy diffusor assembly 33, a vertical cross-section of which is schematically illustrated in FIG. 6, may comprise a support layer 331 and a diffusor structure 332 mounted thereon. For example, the diffusor structure 332 comprises a plurality of diffusor elements 332-1 to 332-4 that may be evenly spaced apart from each other by a distance A. For example, the diffusor elements 332-1 to 332-4 each exhibit a pyramidal shape having an inclination angle $\alpha$. Instead of a pyramidal shape, the diffusor elements 332-1 to 332-4 may also exhibit the shape of a prism, such as a triangular prism.

With regards to FIG. 5A, two different paths of two different ions 36-1 and 36-2 shall be considered: A first ion 36-1 approaches the energy diffusor assembly 33 in a direction substantially perpendicular to a receptor side 331-1 of the support layer 331. The first ion 36-1 enters the energy diffusor assembly 33 at a first point of entry 33-1. When entering the energy diffusor assembly 33, the first ion 36-1 exhibits an energy E1 schematically illustrated by the bold arrow in FIG. 5A. The first ion 36-1 traverses the energy diffusor assembly 33 exactly between two adjacent energy diffusor elements, e.g., energy diffusor elements 332-1 and 332-2. Therefore, the reduction of energy of the first ion 36-1 is comparatively small. After having traversed the energy diffusor assembly 33, the first ion 36-1 exhibits the reduced energy E1'. Then, the first ion 36-1 enters the semiconductor body 11 and reaches an extension depth b2 within the semiconductor body 11.

In contrast, a second ion 36-2 which follows a second path 37-2 enters the energy diffusor assembly 33 at a second point of entry 33-2 such that it traverses through an entire diffusor element, such as a diffusor element 332-3. Prior to entering the energy diffusor assembly 33, the second ion 36-2 exhibits the energy E2, as schematically illustrated by the bold arrow in FIG. 5A. After having traversed the energy diffusor assembly 33 through an entire diffusor element, the energy of the second ion 36-2 is substantially reduced, as indicated by the short bold arrow in FIG. 5A. For example, after having traversed the energy diffusor assembly 33, the second ion 36-2 exhibits the energy E2'. Then, the second ion 36-2 enters the semiconductor body 11 and only reaches an extension depth b1. The extension depth b1 is substantially smaller as compared to the extension depth b2.

In FIG. 5A, two extreme situations are illustrated: The energy reduction induced by the energy diffusor assembly 33 for the first ion 36-1 may be the smallest energy reduction possible, as the first ion 36-1 essentially does not cross a diffusor element of the diffusor structure 332. In contrast, the energy reduction induced for the second ion 36-2 may be a maximum energy reduction, since the second ion 36-2 enters the energy diffusor assembly such that it entirely traverses a diffusor element. In other words, first implantation ions that encounter minimum energy reduction may define the distal end 111-12 of the first semiconductor region 111-1, and first implantation ions that encounter maximum energy reduction may define the proximal end 111-11 of the first semiconductor region 111-1, as schematically illustrated in FIG. 1 and FIG. 2.

Due to the energy diffusor assembly 33, the implantation ions traversing the energy diffusor assembly may reach different extension depths within the semiconductor body 11. This may allow for achieving a substantially homogenous concentration profile c1, e.g., for the first semiconductor regions 111-1 and 111-2, as schematically illustrated in FIG. 5B. In other words, the doping concentration in the first semiconductor regions 111-1 and 111-2 may be substantially homogenous along the extension direction B if the first implantation 31 is carried out while the energy diffusor assembly 33 is positioned in-between the semiconductor body 11 and the implantation apparatus (not shown).

The above described methods of producing a semiconductor device may allow for producing a superjunction structure in a semiconductor body material that exhibits a dopant diffusion coefficient that is smaller than the corresponding dopant diffusion coefficient of silicon. For example, producing the superjunction structure does not comprise carrying out a thermal diffusion step.

However, it should be noted, that the above described methods of producing a semiconductor device by carrying out the first implantation and the second implantation, it may be proceeded layer-wise, e.g., in a manner as exemplary explained with respect with FIG. 7A to FIG. 7C. For example, by proceeding layer-wise, comparatively deep first semiconductor regions can be produced. For every layer, both the first implantation ions and the second implantation ions may be implanted by means of one or more separate implantations. Each of such separate implantation step may comprise using a separate energy diffusor assembly, a separate implantation dose and/or a separate implantation energy. For example, depending on the implantation energy, it may be suitable to repeat the first implantation and the second implantation for about 3 to 8 epitaxy layers of the semiconductor body. For the bottom layers, it may also be possible to widen the concentration profile by means of applying high energy implantations so as to avoid using a separate energy diffusor assemblies for such bottom layers. Further, the separate implantations may be carried out such that the respective first semiconductor region extends along the entire depth of the respective layer that is currently processed. Thereby, a carrying out a thermal diffusion can be avoided, since the first semiconductor regions of neighboring layers are already in contact with each other. Thus, many doping profiles may be accomplished within the semiconductor body.

Further, for improving avalanche robustness, it is possible to introduce one or more further doped regions that only slightly extend along the extension direction. By means of such further doped regions, a dedicated peak of a vertical distribution of the electrical field may be accomplished.

In addition, field stop layers may be introduced in a similar manner between the drift zone formed by the first semiconductor regions and the second semiconductor region on the one side and a highly doped substrate on the other side. Such field stop structures may improve avalanche robustness of the semiconductor device and/or cosmic radiation robustness.

The method presented above may be suited for establishing superjunction structures both within a vertical device concept and within a lateral device concept.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of producing a semiconductor device, the method comprising:
   providing a semiconductor body comprising a semiconductor body material having a dopant diffusion coefficient that is smaller than the corresponding dopant diffusion coefficient of silicon;
   producing, in the semiconductor body, at least one first semiconductor region doped with dopants of a first conductivity type, wherein producing the at least one first semiconductor region includes applying a first implantation of first implantation ions;
   producing, in the semiconductor body, at least one second semiconductor region adjacent to the at least one first semiconductor region and doped with dopants of a second conductivity type complementary to the first conductivity type, wherein producing the at least one second semiconductor region includes applying a second implantation of second implantation ions, the at least one first semiconductor region and the at least one second semiconductor region forming a drift region having a superjunction structure; and
   forming a base region comprising a semiconductor region doped more highly than the at least one second semiconductor region,
   wherein the drift region contacts the base region,
   wherein the at least one first semiconductor region terminates within the drift region and is spaced apart from the base region by a section of the drift region devoid of the at least one first semiconductor region.

2. The method of claim 1, further comprising:
   positioning an energy diffusor assembly between an implantation apparatus and the semiconductor body, the energy diffusor assembly being configured for receiving implantation ions and for outputting received implantation ions such that the output implantation ions have a reduced energy as compared to their energy when entering into the energy diffusor assembly, wherein the amount of reduced energy depends on a point and/or angle of entry into the energy diffusor assembly; and
   applying the first implantation and the second implantation such that at least one of the first implantation ions and the second implantation ions traverse the energy diffusor assembly prior to entering the semiconductor body.

3. The method of claim 2, further comprising:
   masking a surface of the semiconductor body with a first mask, wherein the first implantation is applied while the surface is masked with the first mask.

4. The method of claim 3, further comprising:
   removing the first mask prior to applying the second implantation.

5. The method of claim 3, further comprising:
   masking the surface of the semiconductor body with a second mask, wherein the second implantation is applied while the surface is masked with the second mask, the second mask exhibiting a structure complementary to a structure of the first mask.

6. The method of claim 5, further comprising:
   depositing an energy diffusor material on the second mask for producing the energy diffusor assembly, the energy diffusor material comprising at least one of silicon, silicon dioxide, aluminum, silicon carbide, graphite, carbon, tungsten, molybdenum, titanium, lead, and copper.

7. The method of claim 3, further comprising:
   depositing an energy diffusor material on the first mask for producing the energy diffusor assembly, the energy diffusor material comprising at least one of silicon, silicon dioxide, aluminum, silicon carbide, graphite, carbon, tungsten, molybdenum, titanium, lead, and copper.

8. The method of claim 2, further comprising:
   depositing an energy diffusor material on the semiconductor body for producing the energy diffusor assembly, the energy diffusor material comprising at least one of silicon, silicon dioxide, aluminum, silicon carbide, graphite, carbon, tungsten, molybdenum, titanium, lead, and copper.

9. The method of claim 1, wherein the semiconductor body material of the semiconductor body comprises at least one of: silicon carbide, gallium nitride, aluminum nitride, and a semiconductor material that exhibits a dopant diffusion coefficient that is at least two orders of magnitude lower than the corresponding dopant diffusion coefficient of silicon.

10. The method of claim 1, wherein the semiconductor body comprises an initially non-doped or weakly doped region, and wherein the at least one first semiconductor region and the at least one second semiconductor region are produced within the initially non-doped or weakly doped region.

11. The method of claim 10, wherein the initially non-doped or weakly doped region is one of a silicon carbide layer, a gallium nitride layer, an aluminum nitride layer, and a layer of a semiconductor material that exhibits a dopant diffusion coefficient being at least two orders of magnitude lower than the corresponding dopant diffusion coefficient of silicon.

12. The method of claim 1, wherein the first implantation and the second implantation are applied for establishing a superjunction structure within the semiconductor body by means of the at least one first semiconductor region and the at least one second semiconductor region.

13. The method of claim 1, wherein the doping concentration of the at least one first semiconductor region is substantially identical to the doping concentration of the at least one second semiconductor region.

14. The method of claim 1, further comprising:
forming a further doped layer interposed between the base region and the drift region,
wherein the further doped layer is doped with dopants of the second conductivity type.

* * * * *